(12) United States Patent
Yao

(10) Patent No.: US 12,501,680 B2
(45) Date of Patent: Dec. 16, 2025

(54) METHOD FOR MANUFACTURING A METAL GATE BY A GATE REPLACEMENT PROCESS INCLUDING CARBON ION IMPLANTATION OF A ZERO INTERLAYER DIELECTRIC

(71) Applicant: Shanghai Huali Integrated Circuit Corporation, Shanghai (CN)

(72) Inventor: Zhou Yao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 412 days.

(21) Appl. No.: 18/341,083

(22) Filed: Jun. 26, 2023

(65) Prior Publication Data

US 2024/0154005 A1    May 9, 2024

(51) Int. Cl.
| | |
|---|---|
| *H10D 84/01* | (2025.01) |
| *H01L 21/3115* | (2006.01) |
| *H01L 21/3213* | (2006.01) |
| *H10D 64/01* | (2025.01) |
| *H10D 84/03* | (2025.01) |
| *H10D 64/66* | (2025.01) |

(52) U.S. Cl.
CPC ....... *H10D 64/01* (2025.01); *H01L 21/31155* (2013.01); *H01L 21/32133* (2013.01); *H10D 64/017* (2025.01); *H10D 84/0172* (2025.01); *H10D 84/038* (2025.01); *H10D 64/667* (2025.01)

(58) Field of Classification Search
CPC .......... H10D 84/0144; H10D 84/0181; H10D 84/0172–0179; H10D 84/0135–0142; H01L 21/32133–32138
See application file for complete search history.

(56) References Cited

U.S. PATENT DOCUMENTS

| | | | |
|---|---|---|---|
| 8,546,209 B1 * | 10/2013 | Cheng | H10D 64/017 438/378 |
| 2012/0248550 A1 * | 10/2012 | Huang | H10D 84/83 257/E21.328 |
| 2014/0015104 A1 * | 1/2014 | Su | H01L 21/31155 438/549 |
| 2016/0079034 A1 * | 3/2016 | Yieh | H01L 21/02271 |
| 2019/0164776 A1 * | 5/2019 | Choi | H10D 30/62 |

* cited by examiner

*Primary Examiner* — Younes Boulghassoul
(74) *Attorney, Agent, or Firm* — Banner & Witcoff, Ltd.

(57) ABSTRACT

The present application discloses a method for manufacturing a metal gate, comprising: step 1, providing a semiconductor substrate on which dummy polysilicon gates are formed, wherein a first gate dielectric layer is formed at the bottom of the dummy polysilicon gates, and a spacing region between the dummy polysilicon gates is filled with a zero interlayer dielectric; step 2, removing the dummy polysilicon gates, comprising: step 21, performing first dry etching to remove a part of the thickness of the dummy polysilicon gate; step 22, performing carbon ion implantation to form a carbon containing surface region of the zero interlayer dielectric; and step 23, performing second wet etching to fully remove the remaining dummy polysilicon gates; step 3, performing third etching to remove the first gate dielectric layer; and step 4, forming a second gate dielectric layer and a metal gate.

15 Claims, 7 Drawing Sheets

Step 1. A semiconductor substrate on which dummy polysilicon gates are formed is provided, wherein a first gate dielectric layer is formed at the bottom of the dummy polysilicon gate, and a spacing region between the dummy polysilicon gates is filled with a zero interlayer dielectric

Step 2. The dummy polysilicon gate is removed, including

Step 21. First dry etching is performed to remove the dummy polysilicon gate of part of the thickness thereof

Step 22. Carbon ion implantation is performed to form a zero interlayer dielectric surface layer

Step 23. Second wet etching is performed to fully remove the remaining dummy polysilicon gate

Step 3. Third etching is performed to remove the first gate dielectric layer, wherein the zero interlayer dielectric surface layer reduces an etching rate of the third etching on the zero interlayer dielectric, thereby reducing a loss of the zero interlayer dielectric

Step 4. A second gate dielectric layer and a metal gate are formed

FIG. 1

METHOD FOR MANUFACTURING A METAL GATE BY A GATE REPLACEMENT PROCESS INCLUDING CARBON ION IMPLANTATION OF A ZERO INTERLAYER DIELECTRIC

CROSS-REFERENCES TO RELATED APPLICATIONS

This application claims the priority to Chinese patent application No. CN202211392749.6, filed on Nov. 8, 2022, and entitled "METHOD FOR MANUFACTURING METAL GATE", the disclosure of which is incorporated herein by reference in entirety.

TECHNICAL FIELD

The present application relates to the field of semiconductor integrated circuit manufacturing, in particular, to a method for manufacturing a metal gate (MG).

BACKGROUND

With continuous development of the semiconductor technology, a relatively large electric leakage may occur in planar metal-oxide-semiconductor (MOS) transistors thus a fin field effect transistor (FinFET) can be used. Typically, in the FinFET, a gate structure includes a metal gate, and a gate dielectric layer which can be silicon oxide or a high dielectric constant layer (HK). A gate structure formed by a stack of a metal gate and a gate dielectric layer having a high dielectric constant is referred to as HKMG.

The metal gate is generally formed by a gate-last process. In the gate-last process, a dummy polysilicon gate (Dummy Poly Silicon) defines a formation region of the gate structure, and a spacer and a source drain region are formed in a self-aligned manner later; subsequently, a zero interlayer dielectric (ILD) is formed to fill spacing regions between the dummy polysilicon gates, followed by planarization to expose the surfaces of the dummy polysilicon gates; after that, the dummy polysilicon gate is removed (Dummy Poly Remove), then, a gate trench is formed in the region where the dummy polysilicon gate was removed, at the end, the high-K metal gate (HKMG) is formed in the gate trench.

The gate dielectric layer can be formed by either a gate dielectric layer-first process or a gate dielectric layer-last process as needed. In the gate dielectric layer-first process, the gate dielectric layer is formed before forming the dummy polysilicon gate, then the gate dielectric layer is removed after the forming the dummy polysilicon gate. In the gate dielectric layer-last process, a dummy gate dielectric layer is used to replace the gate dielectric layer before the forming the dummy polysilicon gate, the dummy gate dielectric layer is then removed after the removal of the dummy polysilicon gate, at the end, the gate dielectric layer and the metal gate are formed in sequence.

Because there is a relatively narrow spacing region between two gate structures for filling the spacing region, in order to achieve good filling of the spacing region, a zero interlayer dielectric is typically formed by a flowable chemical vapor deposition (FCVD) or other processes which facilitate via-hole fillings. An oxide layer formed by the FCVD process is generally referred to as an FCVD oxide layer. The film quality of the FCVD oxide layer is relatively poor, resulting in low performance of the zero interlayer dielectric.

Generally, a core device and an input/output (TO) device are both integrated on the same semiconductor substrate, where an operating voltage of the input/output device is higher than an operating voltage of the core device, so the two kinds of devices have different gate structures. The thickness of a gate dielectric layer of the input/output device is usually greater than the thickness of a gate dielectric layer of the core device, so a dual gate process loop is required to form the gate structures for both the core device and the input/output device.

The gate dielectric layer of input/output device is typically an oxide layer formed by an in-situ steam generation (ISSG) process, i.e., an ISSG oxide layer. The ISSG oxide layer is formed before the formation of the dummy polysilicon gate and is removed after the removal of the dummy polysilicon gate. It is necessary to protect an input/output region, i.e., a formation region of the input/output device, and then remove the IS SG oxide layer from a core region, i.e., a formation region of the core device. After removal of the ISSG oxide layer from the core device, it is necessary to regrow a gate dielectric layer in the core region, and then metal gates are formed in the core region and the input/output region simultaneously.

Compared with the FCVD oxide layer, the ISSG oxide layer has a better quality, such that an etching rate on the ISSG oxide layer is lower than an etching rate on the FCVD oxide layer during the removal of the ISSG oxide layer. Since the surface of the FCVD oxide layer in the core region is exposed during etching of the ISSG oxide layer, a loss of the FCVD oxide layer in the core region occurs. When the loss of the FCVD oxide layer is significantly large, there is worse loss in ILD uniformity in the wafer, eventually rendering the surface of the FCVD oxide layer uneven, i.e., eventually producing uneven surface of the zero interlayer dielectric layer. The requirement on the capability of the subsequent chemical-mechanical-polishing (CMP) process on the gate conductive material layer of the metal gates, such as tungsten gates, has become extremely stringent, thus compressing a metal gate deposition process window and thereby leading to device failures.

BRIEF SUMMARY

According to some embodiments in this application, a method for manufacturing a metal gate is disclosed in the following steps:
  step 1, providing a semiconductor substrate, forming a plurality of dummy polysilicon gates on the semiconductor substrate, and forming a first gate dielectric layer between the dummy polysilicon gate and the semiconductor substrate; and
  providing a spacing region between the dummy polysilicon gates, the spacing region is filled with a zero interlayer dielectric, and a top surface of the dummy polysilicon gate is flush with a top surface of the zero interlayer dielectric;
  step 2, removing the dummy polysilicon gate, including the following substeps:
  step 21, performing first dry etching to remove the dummy polysilicon gate of part of the thickness thereof;
  step 22, implanting carbon into a surface region of the zero interlayer dielectric by means of carbon ion implantation, and forming a zero interlayer dielectric surface layer in a carbon implantation region; and
  step 23, performing second wet etching to fully remove the remaining dummy polysilicon gate;

step 3, performing third etching to remove the first gate dielectric layer, wherein the zero interlayer dielectric surface layer reduces an etching rate of the third etching on the zero interlayer dielectric, thereby reducing a loss of the zero interlayer dielectric; and step 4, forming a second gate dielectric layer and a metal gate in a region where the first gate dielectric layer and the dummy polysilicon gate are removed.

In some cases, the semiconductor substrate includes a silicon substrate.

In some cases, the first gate dielectric layer is an oxide layer formed by an in-situ steam generation process.

In some cases, the zero interlayer dielectric includes an oxide layer formed by a high aspect ratio process (HARP) process or an oxide layer formed by an FCVD process.

In some cases, the semiconductor substrate includes a core region and an input/output region, a core device is formed in the core region, and an input/output device is formed in the input/output region.

In some cases, the first gate dielectric layer serves as a gate dielectric layer of the input/output device.

In step 3, a first mask pattern needs to be defined before the third etching, the first mask pattern covering the input/output region and opening the core region.

In some cases, the second gate dielectric layer serves as a gate dielectric layer of the core device, and the thickness of the second gate dielectric layer is less than the thickness of the first gate dielectric layer.

In some cases, the second gate dielectric layer is formed separately in the core region; alternatively, the second gate dielectric layer is stacked on the surface of the first gate dielectric layer in the input/output region.

In some cases, a formation process of the metal gate includes:

forming a metal work function layer; and
forming a metal conductive material layer.

In some cases, the material of the metal conductive material layer includes tungsten.

In some cases, the core device includes a core NMOS and a core PMOS, and the input/output device includes an input/output NMOS and an input/output PMOS.

The material of the metal work function layers of the core NMOS and the input/output NMOS includes TiAl.

The material of the metal work function layers of the core PMOS and the input/output PMOS includes TiN.

In some cases, the metal work function layers of the core NMOS and the input/output NMOS are formed simultaneously, and the metal work function layers of the core PMOS and the input/output PMOS are formed simultaneously.

The metal conductive material layers of the core region and the input/output region are formed simultaneously.

In some cases, after deposition of the metal conductive material layer, the method further includes performing planarization by means of a chemical mechanical polishing process.

In some cases, the thickness of the first gate dielectric layer is several nanometers.

In some cases, the thickness of the zero interlayer dielectric surface layer is several nanometers.

In the present application, the dummy polysilicon gate is removed by combining the first dry etching and the second wet etching, after the first dry etching, then carbon (C) ion implantation is performed to form the carbon-doped zero interlayer dielectric surface layer in the surface region of the zero interlayer dielectric. In this way, during the third etching to remove the first gate dielectric layer after the second wet etching, the zero interlayer dielectric surface layer can effectively protect the zero interlayer dielectric, so as to reduce the loss of the zero interlayer dielectric and improve the surface flatness of the zero interlayer dielectric, thereby improving subsequent metal gate filling and the CMP process window, and eventually improving the product performance and yield.

BRIEF DESCRIPTION OF THE DRAWINGS

The present application will be further described in detail below with reference to the drawings and specific implementations:

FIG. 1 is a flowchart of a method for manufacturing a metal gate according to an embodiment of the present application.

DETAILED DESCRIPTION OF THE DISCLOSURE

Figure 2A:
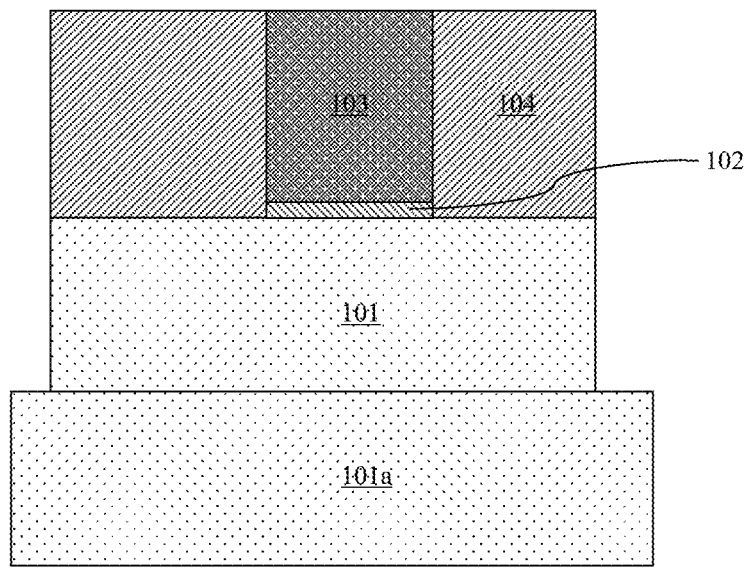
FIGS. 2A-2E illustrate cross sectional views of the device structure cut along the length direction of a fin during the steps of manufacturing a metal gate according to an embodiment of the present application.
Figure 3A:
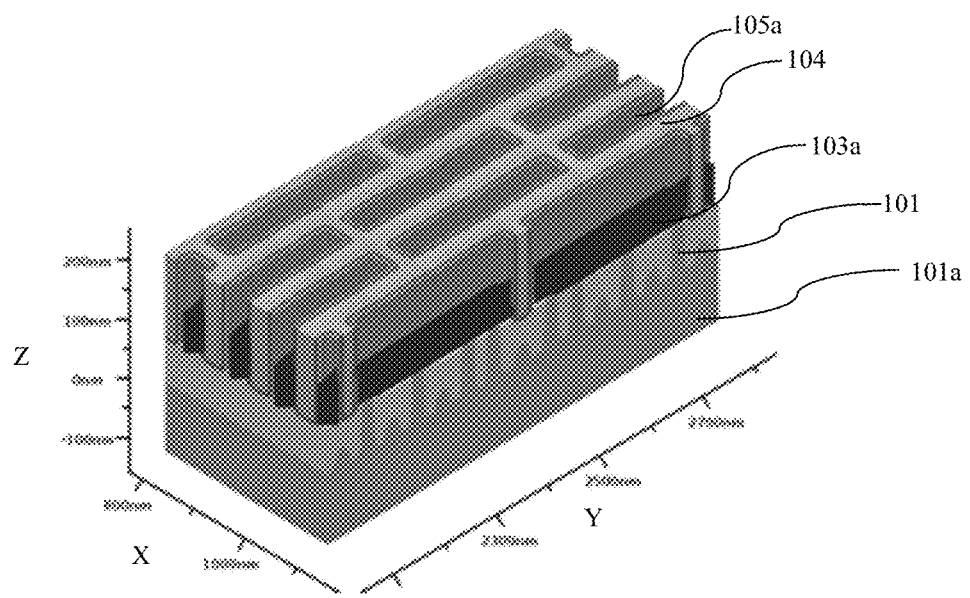
FIGS. 3A-3D illustrate stereoscopic diagrams of the device structures during the steps of manufacturing a metal gate according to an embodiment of the present application.

FIG. 1 is a flowchart of a method for manufacturing a metal gate according to an embodiment of the present application. FIGS. 2A-2E illustrate cross sectional views of the device structure cut along the length direction of a fin 101 during the steps of manufacturing a metal gate according to an embodiment of the present application. FIGS. 3A-3D are stereoscopic diagrams of device structures during the steps of manufacturing a metal gate according to an embodiment of the present application. The method for manufacturing a metal gate in this embodiment of the present application includes the following steps:

Step 1. Referring to FIGS. 2A and 3A, providing a semiconductor substrate 101a, forming a plurality of dummy polysilicon gates 103 on the semiconductor substrate 101a, and forming a first gate dielectric layer 102 between the dummy polysilicon gate 103 and the semiconductor substrate 101a.

Providing spacing region between the dummy polysilicon gates 103, the spacing region is filled with a zero interlayer dielectric 104, and a top surface of the dummy polysilicon gate 103 is flush with a top surface of the zero interlayer dielectric 104.

In this embodiment of the present application, the semiconductor substrate 101a includes a silicon substrate.

The fin 101 is formed on the semiconductor substrate 101a, and the fin 101 is formed by performing patterned etching on the semiconductor substrate 101a. In FIG. 3A, 3A, the X-axis direction is along the length direction of the fin 101, the Y-axis direction is along the length direction of the dummy polysilicon gate 103, and the Z-axis direction is along a direction perpendicular to the surface of the semiconductor substrate 101.

As can be seen from FIG. 3A, an isolation structure such as a shallow trench isolation is also formed between the fins 101.

The first gate dielectric layer 102 is an oxide layer formed by an in-situ steam generation process.

In methods of some embodiments, the zero interlayer dielectric is an oxide layer formed by a HARP process. In methods of other embodiments, the zero interlayer dielectric can also be formed by other processes with a good via filling capability, for example, the zero interlayer dielectric is an oxide layer formed by an FCVD process.

The semiconductor substrate 101a includes a core region and an input/output region, a core device is formed in the core region, and an input/output device is formed in the input/output region. FIGS. 2A and 3A both show the core region.

The first gate dielectric layer 102 serves as a gate dielectric layer of the input/output device. The thickness of the first gate dielectric layer 102 is several nanometers, e.g., about four nanometers.

Figure 2B:
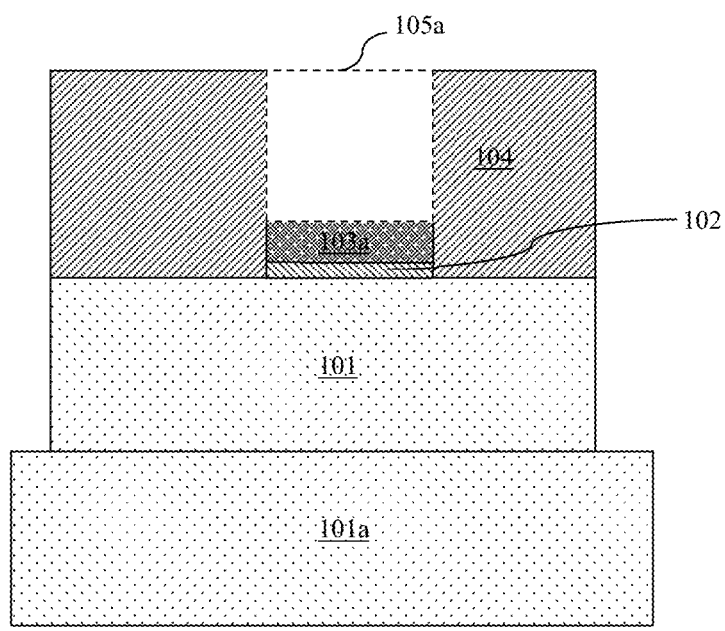

Step 2. The dummy polysilicon gate 103 is removed, including the following substeps:

Step 21. Referring to FIGS. 2B and 3A, first dry etching is performed to remove a part of the thickness from the dummy polysilicon gate 103. The dummy polysilicon gate remains after the removal is marked separately with a reference numeral 103a, and a gate trench 105a is formed in the area where part of the dummy polysilicon gate has been removed from the top of the dummy polysilicon gate 103a.

Figure 2C:
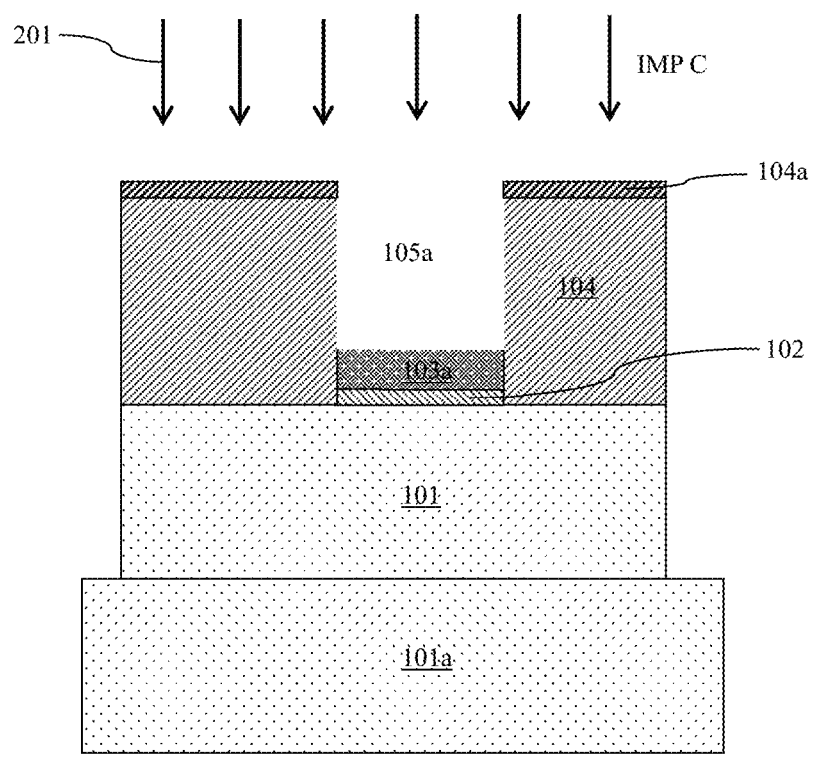
Figure 3B:
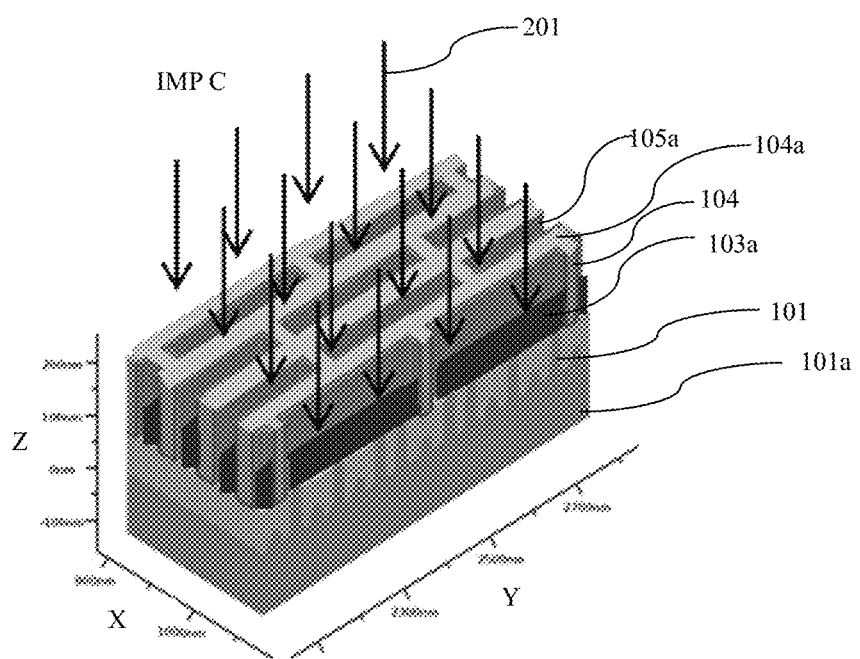

Step 22. Referring to FIGS. 2C and 3B, implanting carbon into the surface region of the zero interlayer dielectric by means of carbon ion implantation, and forming a zero interlayer dielectric surface layer 104a in the carbon implanted region. Carbon ion implantation is indicated by arrow lines labeled as 201 and IMP C next to the arrow lines 201.

The thickness of the zero interlayer dielectric surface layer is a few nanometers, e.g., about 5 nm.

Figure 2D:
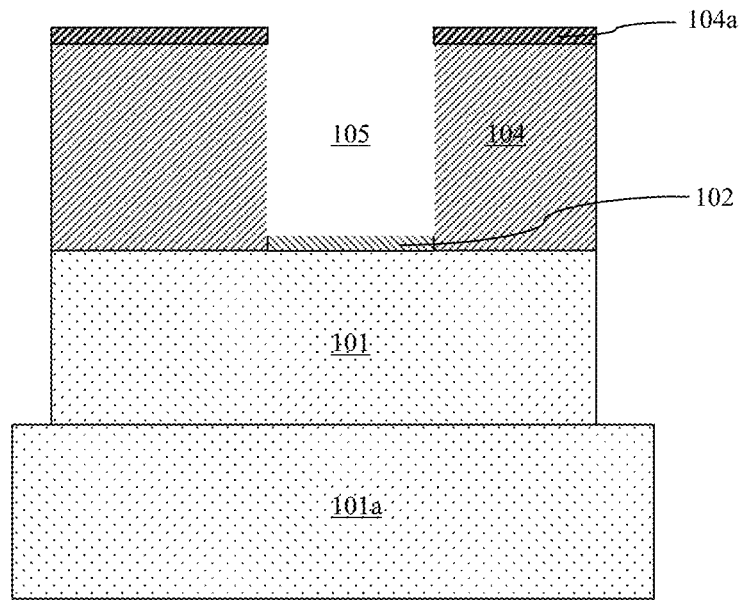
Figure 3C:
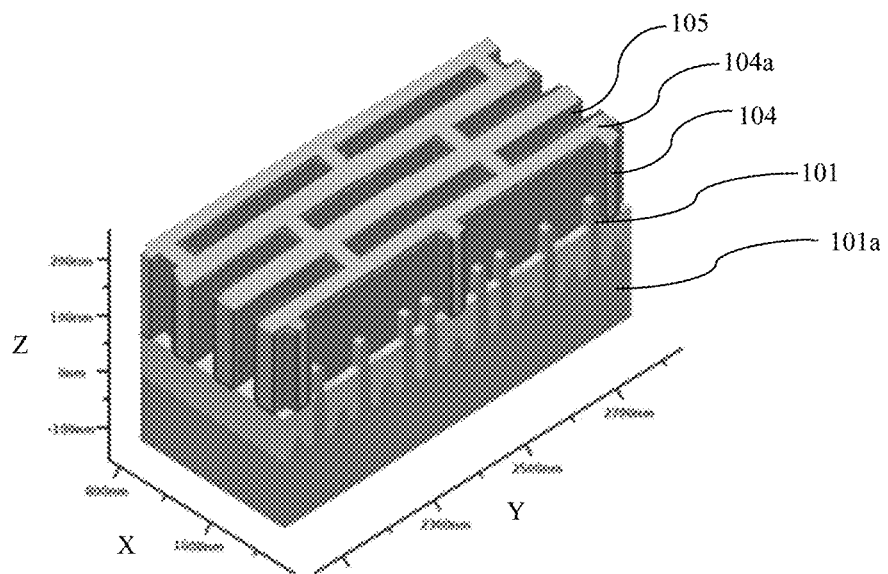

Step 23. Referring to FIGS. 2D and 3C, performed the second wet etching to fully remove the remaining dummy polysilicon gate 103a, finally forming a gate trench 105. In FIG. 2D, the surface of the fin 101 is also covered with the first gate dielectric layer 102.

Figure 2E:
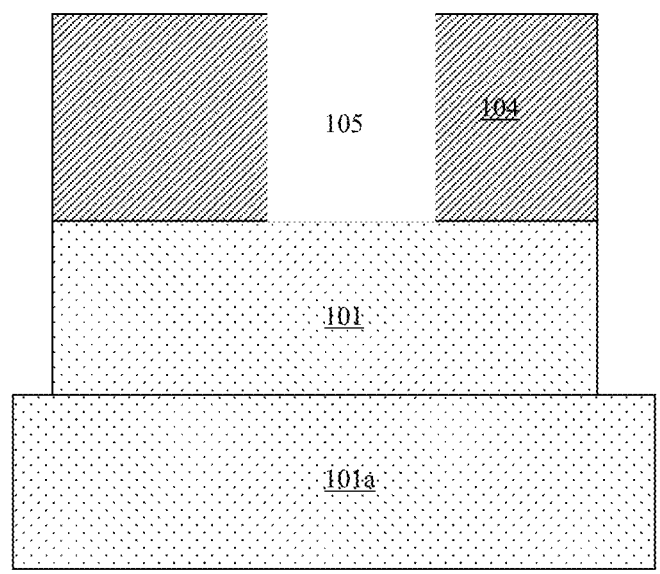
Figure 3D:
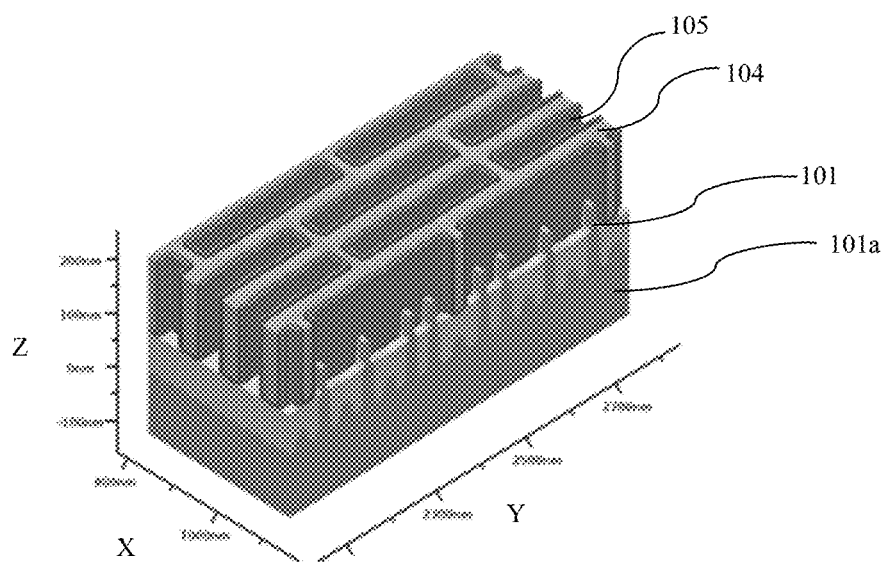

Step 3. Referring to FIGS. 2E and 3D, performing the third etching to remove the first gate dielectric layer 102, wherein the zero interlayer dielectric surface layer 104a reduces the etching rate of the third etching on the zero interlayer dielectric 104, thereby reducing a loss of the zero interlayer dielectric 104, and the zero interlayer dielectric surface layer 104a is fully consumed at last.

In this embodiment of the present application, a first mask pattern is needed to define the third etching, and this first mask pattern covers the input/output region and opens the core region.

Step 4. Forming a second gate dielectric layer and forming a metal gate in a region where the first gate dielectric layer 102 and the dummy polysilicon gate 103 are removed.

The second gate dielectric layer serves as a gate dielectric layer of the core device, and the thickness of the second gate dielectric layer is less than the thickness of the first gate dielectric layer 102.

Forming a second gate dielectric layer separately in the core region; alternatively, stacking the second gate dielectric layer on the surface of the first gate dielectric layer 102 in the input/output region.

A formation process of the metal gate includes the following:

Forming a metal work function layer.
Forming a metal conductive material layer.
The material of the metal conductive material layer includes tungsten.

The core device includes a core NMOS and a core PMOS, and the input/output device includes an input/output NMOS and an input/output PMOS.

The material of the metal work function layers of the core NMOS and the input/output NMOS includes TiAl.

The material of the metal work function layers of the core PMOS and the input/output PMOS includes TiN.

The metal work function layers of the core NMOS and the input/output NMOS are formed simultaneously, and the metal work function layers of the core PMOS and the input/output PMOS are formed simultaneously.

The metal conductive material layers of the core region and the input/output region are formed simultaneously.

After deposition of the metal conductive material layer, the method further includes performing planarization by means of a chemical mechanical polishing process.

Figure 4:
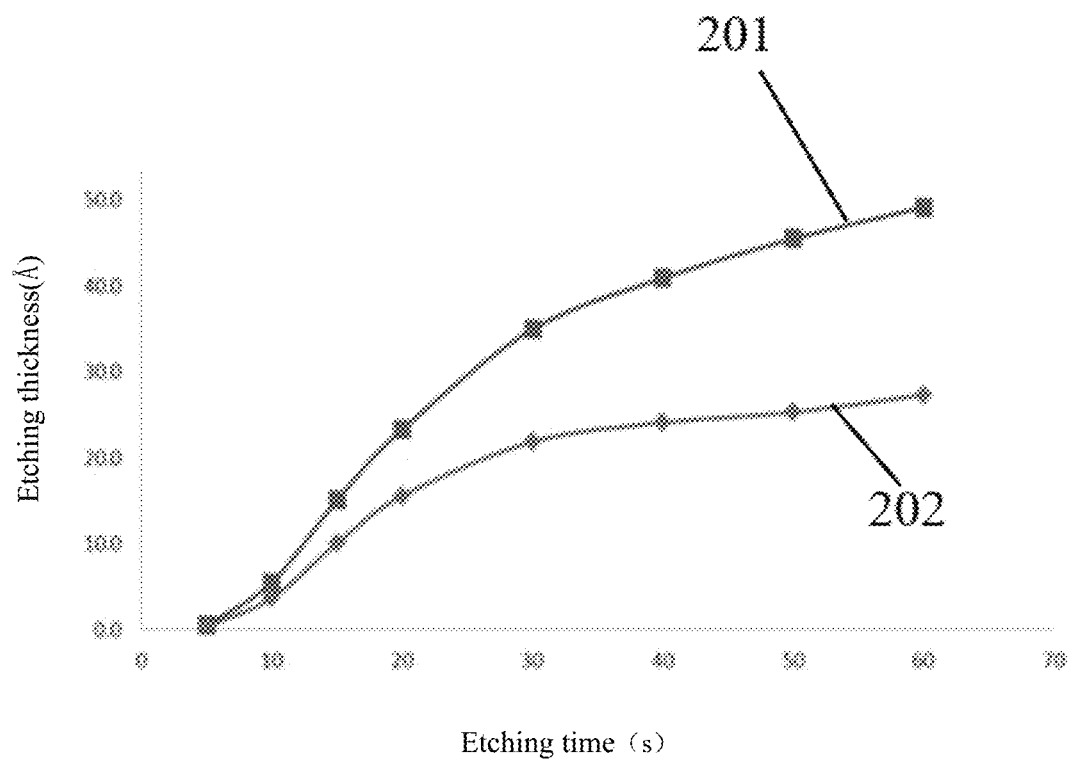
FIG. 4 illustrates the performance of the zero interlayer dielectric film thickness variation versus the time spent in the third etching. One curve shows data according to an embodiment of the present application, and another curve shows data from an existing method.

In this embodiment of the present application, the dummy polysilicon gate 103 is removed by combining the first dry etching and the second wet etching, after the first dry etching, and the carbon ion implantation is performed to form the carbon-doped zero interlayer dielectric surface layer 104a in the surface region of the zero interlayer dielectric 104. In this way, during the third etching for removing the first gate dielectric layer 102 after the second wet etching, the zero interlayer dielectric surface layer 104a can effectively protect the zero interlayer dielectric 104, so as to reduce the loss of the zero interlayer dielectric 104. FIG. 4 illustrates the performance of the zero interlayer dielectric film thickness variation versus the time spent in the third etching. One curve 202 shows data according to an embodiment of the present application, and another curve s201 shows data from an existing method. It can be seen that the thickness after etch corresponding to the curve 202 decreases, that is, the loss of the zero interlayer dielectric 104 decreases, improving the surface flatness of the zero interlayer dielectric 104, thereby improving subsequent metal gate filling and a CMP process window and eventually improving the product performance and yield.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for manufacturing a metal gate, comprising following steps:
    step 1, providing a semiconductor substrate, forming a plurality of dummy polysilicon gates on the semiconductor substrate, and forming a first gate dielectric layer between the plurality of dummy polysilicon gates and the semiconductor substrate; and
    providing a spacing region between two of the plurality of the dummy polysilicon gates, the spacing region is filled with a zero interlayer dielectric, and a top surface of the plurality of dummy polysilicon gates is flush with a top surface of the zero interlayer dielectric;
    step 2, removing the plurality of dummy polysilicon gates, comprising the following substeps:
    step 21, performing a first dry etching to remove a part of a thickness of the plurality of dummy polysilicon gates;

step 22, performing carbon ion implantation into a surface layer of the zero interlayer dielectric; and step 23, performing a second wet etching to fully remove the remaining plurality of dummy polysilicon gates;

step 3, performing a third etching to remove the first gate dielectric layer, wherein the carbon containing surface layer of the zero interlayer dielectric reduces an etching rate of the third etching on the zero interlayer dielectric, wherein the zero interlayer dielectric has less loss after the third etching; and step 4, forming a second gate dielectric layer and a metal gate on the second gate dielectric layer in a region where the first gate dielectric layer and the plurality of dummy polysilicon gates are removed.

2. The method for manufacturing the metal gate according to claim 1, wherein the semiconductor substrate comprises a silicon substrate.

3. The method for manufacturing the metal gate according to claim 1, wherein the first gate dielectric layer is an oxide layer formed by an in-situ steam generation process.

4. The method for manufacturing the metal gate according to claim 3, wherein the zero interlayer dielectric comprises a first oxide layer formed by a HARP process or a second oxide layer formed by an FCVD process.

5. The method for manufacturing the metal gate according to claim 3, wherein the semiconductor substrate comprises a core region and an input/output region, wherein a core device is formed in the core region, and an input/output device is formed in the input/output region.

6. The method for manufacturing the metal gate according to claim 5, wherein the first gate dielectric layer serves as a gate dielectric layer of the input/output device; and in step 3, defining a first mask pattern before the third etching, wherein the first mask pattern covers the input/output region and opens the core region.

7. The method for manufacturing the metal gate according to claim 6, wherein the second gate dielectric layer serves as a gate dielectric layer of the core device, wherein a thickness of the second gate dielectric layer is less than a thickness of the first gate dielectric layer.

8. The method for manufacturing the metal gate according to claim 7, wherein the second gate dielectric layer is formed separately in the core region; or alternatively, the second gate dielectric layer is stacked on a surface of the first gate dielectric layer in the input/output region.

9. The method for manufacturing the metal gate according to claim 7, wherein a formation process of the metal gate comprises:

forming a metal work function layer; and forming a metal conductive material layer.

10. The method for manufacturing the metal gate according to claim 9, wherein the material of the metal conductive material layer comprises tungsten.

11. The method for manufacturing the metal gate according to claim 9, wherein the core device comprises a core NMOS and a core PMOS, and wherein the input/output device comprises an input/output NMOS and an input/output PMOS;

a material of the metal work function layers of a core NMOS and an input/output NMOS comprises TiAl; and a material of the metal work function layers of a core PMOS and an input/output PMOS comprises TiN.

12. The method for manufacturing the metal gate according to claim 11, wherein the metal work function layers of the core NMOS and the input/output NMOS are formed simultaneously, and wherein the metal work function layers of the core PMOS and the input/output PMOS are formed simultaneously; and a metal conductive material layer of the core region and a metal conductive material layer of the input/output region are formed simultaneously.

13. The method for manufacturing the metal gate according to claim 12, wherein after depositing the metal conductive material layer, the method further comprises performing planarization by means of a chemical mechanical polishing process.

14. The method for manufacturing the metal gate according to claim 6, wherein the thickness of the first gate dielectric layer is several nanometers.

15. The method for manufacturing the metal gate according to claim 14, wherein a thickness of the zero interlayer dielectric surface layer is several nanometers.

* * * * *